United States Patent
Horchler

(10) Patent No.: US 6,313,689 B1
(45) Date of Patent: Nov. 6, 2001

(54) POWER SWITCHING CIRCUIT WITH REDUCED INTERFERENCE RADIATION

(75) Inventor: Wolfgang Horchler, Rosenheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/373,523

(22) Filed: Aug. 12, 1999

(30) Foreign Application Priority Data

Aug. 12, 1998 (DE) .............................................. 198 36 577

(51) Int. Cl.[7] ........................... H03K 17/16; H03K 17/30
(52) U.S. Cl. .................... 327/379; 327/350; 327/424; 327/108
(58) Field of Search .................... 327/63, 65, 67, 327/379, 423, 424, 493, 494, 587, 588, 510, 511, 109, 110, 427, 346, 170, 350, 108; 307/126, 130

(56) References Cited

U.S. PATENT DOCUMENTS

| | | | |
|---|---|---|---|
| 4,094,186 | * | 6/1978 | Wessel .................................. 73/1.06 |
| 4,473,759 | * | 9/1984 | Mahabadi .............................. 327/63 |
| 4,540,893 | | 9/1985 | Bloomer ................................ 327/170 |
| 5,194,760 | | 3/1993 | Braun et al. ......................... 327/110 |
| 5,214,316 | * | 5/1993 | Nagai .................................... 327/545 |
| 5,336,943 | * | 8/1994 | Kelly et al. ............................ 327/63 |
| 5,894,234 | * | 4/1999 | Morris .................................... 327/65 |

FOREIGN PATENT DOCUMENTS

0508171A1   10/1992 (EP) .

* cited by examiner

Primary Examiner—Terry D. Cunningham
Assistant Examiner—Long Nguyen
(74) Attorney, Agent, or Firm—Herbert L. Lerner; Laurence A. Greenberg; Werner H. Stemer

(57) ABSTRACT

A power switching circuit with reduced interference radiation includes at least one pair of low-side and high-side MOS power transistors, between which a load resistor is connected. One or at least one of the low-side MOS power transistors is connected to a drive circuit having a divider for dividing a difference between a maximum output voltage of the MOS power transistor and an instantaneous output voltage at the load resistor as a dividend, by a maximum output voltage of the MOS power transistor as a divisor, and a level converter for generating a drive voltage for the MOS power transistor. The drive voltage is proportional to the quotient.

21 Claims, 3 Drawing Sheets

POWER SWITCHING CIRCUIT WITH REDUCED INTERFERENCE RADIATION

BACKGROUND OF THE INVENTION

Field of the Invention

The invention relates to a power switching circuit with reduced interference radiation having one or more MOS power transistors.

MOS output stages which form a part of integrated MOS power switching circuits such as, for example, switches or bridge circuits, enable large voltages and currents to be switched with very short rise times and a virtually ideal square-wave shape. However, higher-order spectral components containing those signals in many cases act as interference radiation which affects adjacent electrical or electronic devices and can impair their functioning. For that reason, the possibilities for using such MOS output stages are frequently limited for lack of their electromagnetic compatibility (EMC).

SUMMARY OF THE INVENTION

It is accordingly an object of the invention to provide a power switching circuit with reduced interference radiation, which overcomes the hereinafore-mentioned disadvantages of the heretofore-known devices of this general type and which has one or more MOS power transistors that enables particularly reliable and effective suppression of instances of interference radiation, particularly during rapid switching processes, in conjunction with a low outlay for circuitry.

With the foregoing and other objects in view there is provided, in accordance with the invention, a power switching circuit with reduced interference radiation, comprising at least one MOS power transistor; and a drive circuit connected to one or at least one MOS power transistor, the drive circuit having a divider for dividing a difference between a maximum output voltage of the at least one MOS power transistor and an instantaneous output voltage at the at least one MOS power transistor as a dividend, by the maximum output voltage of the at least one MOS power transistor as a divisor, to produce a quotient; and a level converter for generating a drive voltage proportional to the quotient for driving the at least one MOS power transistor.

With the objects of the invention in view there is also provided a power switching circuit with reduced interference radiation, comprising at least one pair of low-side and high-side MOS power transistors; a load resistor connected between the MOS power transistors; and a first drive circuit connected to one or at least one low-side MOS power transistor, the first drive circuit having a divider for dividing a difference between a maximum output voltage of the at least one low-side MOS power transistor and an instantaneous output voltage at the load resistor as a dividend, by the maximum output voltage of the at least one low-side MOS power transistor as a divisor, to produce a quotient; and a level converter for generating a drive voltage proportional to the quotient for driving the at least one low-side MOS power transistor.

The invention is based on the fact that particularly effective suppression of interfering harmonic components is possible in MOS power switching circuits when the circuit "recognizes" the extent to which the instantaneous output voltage ($V_{tx}$ or $V_{out}$) of the relevant power transistor has approximated the maximum output voltage ($V_s$, generally the supply voltage), in order to regulate back the drive voltage ($V_a$) proportionally to the difference between those two voltages.

However, the absolute difference is not critical in that case since, given the same difference, for example in the case of a high maximum output voltage ($V_s$), the instantaneous output voltage ($V_{tx}$ or $V_{out}$) is nearer in terms of percentage to the maximum output voltage than in the case of a lower maximum output voltage. Therefore, a signal is only suitable for regulating back the drive voltage ($V_a$) of an MOS transistor when it is related to the maximum output voltage ($V_s$). In other words, it is proportional in accordance with the following formula:

$$V_a \sim (V_s - V_{tx})/V_s.$$

In the case of push-pull and bridge circuits having at least one pair of low-side and high-side MOS power transistors, between which a load resistor is connected, the following formula $\{1\}$ holds true for the low-side transistor or transistors:

$$V_a \sim (V_s - bV_{out})/V_s,$$

where "Vout" is the output voltage at the load resistor and the factors "a" and "b" may have values in the region of 0.5, 1 or 2.

With $V_{tx} = V_s - V_{out}$, the following formula $\{2\}$ holds true for the high-side transistor or transistors:

$$V_a \sim aV_{out}/bV_s,$$

where the factors "a" and "b" may again have values in the region of 0.5, 1 or 2.

The solutions according to the invention described above make use of this insight in that the gates of the MOS transistors are charged and discharged in a defined manner in order to produce "rounded" output characteristic curves in this way, with which the harmonic components are significantly smaller.

In accordance with another feature of the invention, one or at least one of the high-side MOS power transistors may be connected to a second drive circuit in which the divider is provided for dividing an instantaneous output voltage ($V_{out}$) at the load resistor (L) (as a dividend) by the maximum output voltage ($V_s$) of the MOS power transistor (as a divisor).

In accordance with a further feature of the invention, the divider is preferably constructed as a first and a second element for logarithmizing the dividend and the divisor, a subtractor for subtracting the logarithmized values, and the level converter connected thereto and having an exponential element for generating the quotient.

In accordance with an added feature of the invention, the first and second elements may be respective first and second diodes, on which a first and a second current is respectively impressed, wherein the currents are in each case proportional to the output voltages to be divided.

In accordance with an additional feature of the invention, the first current is preferably generated through the use of a first resistor to which the supply voltage ($V_s$) is applied, a second resistor to which the output voltage ($V_{out}$) is applied, and a transistor differential stage connected to these resistors, while the second current may be generated through the use of a third resistor to which the supply voltage ($V_s$) is applied.

In accordance with yet another feature of the invention, the subtractor preferably includes an operational amplifier having a non-inverting input to which a voltage dropped across the first diode is applied and an inverting input to which a voltage dropped across the second diode is applied.

In accordance with yet a further feature of the invention, the maximum output voltage is a supply voltage.

In accordance with yet an added feature of the invention, the dividend is a difference between the maximum output voltage and the instantaneous output voltage multiplied by a predetermined factor.

In accordance with a concomitant feature of the invention, the factor has a value of 0.5, 1 or 2.

Other features which are considered as characteristic for the invention are set forth in the appended claims.

Although the invention is illustrated and described herein as embodied in a power switching circuit with reduced interference radiation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
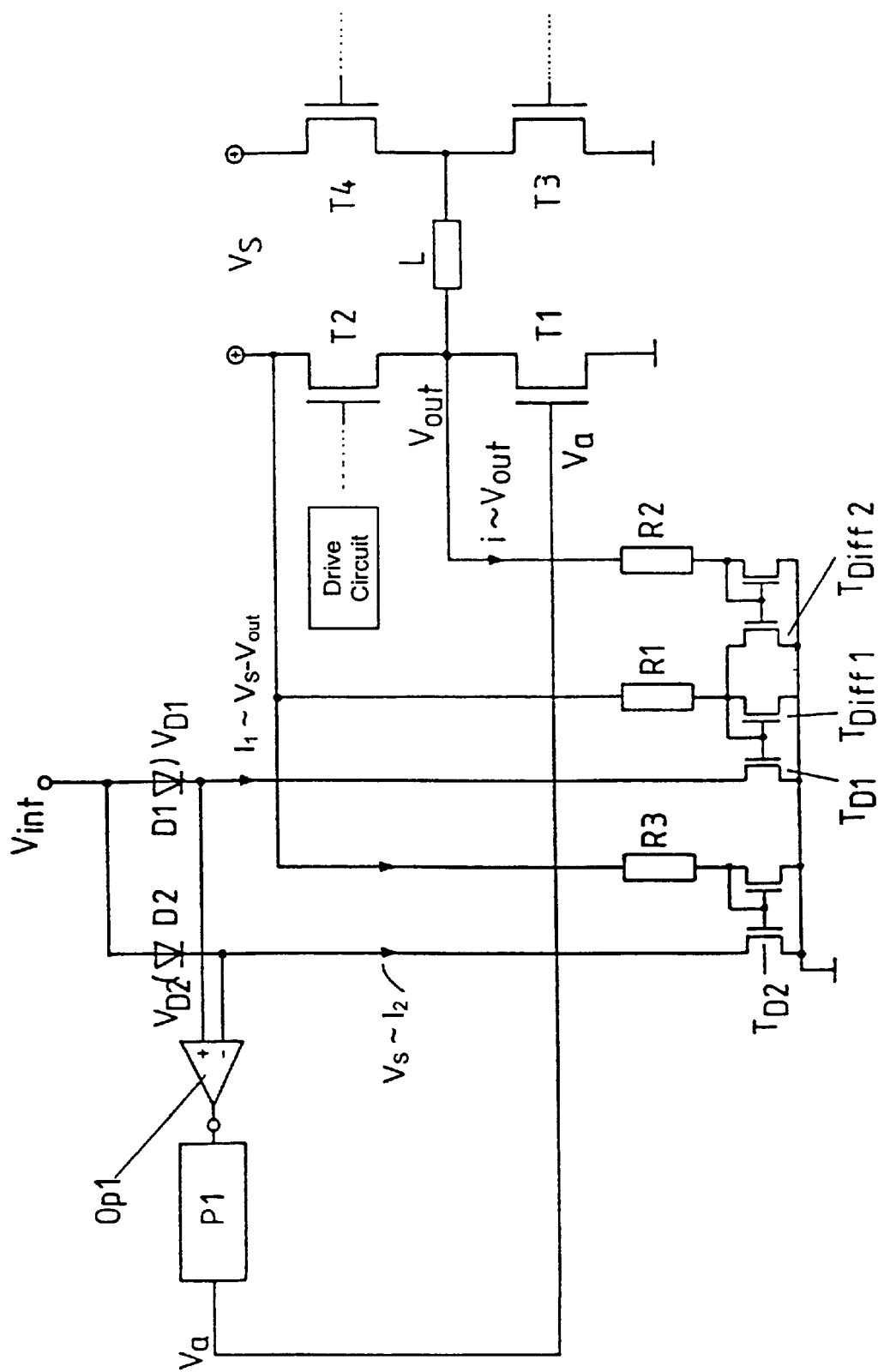
FIG. 1 is a basic schematic circuit diagram of a power switching circuit according to the invention, restricted to a drive circuit.

Referring now to the figures of the drawings in detail and first, particularly, to FIG. 1 thereof, there is seen a basic circuit diagram having a right-hand part in which an MOS output stage formed by first and second MOS power transistor pairs connected in parallel (bridge circuit) is illustrated. The first transistor pair includes series-connected low-side and high-side transistors T1, T2, while the second transistor pair is formed by series-connected low-side and high-side transistors T3, T4. A load resistor L is connected between the transistor pairs, while a supply voltage $V_s$ is applied to the high-side and low-side transistors.

A drive circuit according to the invention is shown only for the low-side transistor T1 of the first transistor pair T1, T2. The low-side transistor T3 of the second pair can be connected to an identical drive circuit. With regard to the high-side transistors T2, T4, these too may each have a drive circuit according to the invention. However, in that case, the subtraction of the currents which is described below for the low-side transistors and is necessary in accordance with the above formula {1} is omitted (see above formula {2}).

According to FIG. 1, the drive circuit according to the invention includes a first diode D1, a second diode D2 and an operational amplifier Op1. A non-inverting input of the operational amplifier Op1 is connected to a cathode of the first diode D1 and an inverting input of the operational amplifier Op1 is connected to a cathode of the second diode D2. Anodes of the diodes D1 and D2 are connected to a terminal Vint, which serves for feeding in a supply potential for setting an operating range of the circuit components. An output of the operational amplifier Op1 is passed through a level converter P1 with an exponential element to a gate terminal of the low-side MOS power transistor T1.

The supply voltage $V_s$ fed to the MOS power transistors T2 and T4 is also applied to a first resistor R1 and a third resistor R3. An output voltage $V_{out}$ generated by the MOS power transistors T1 to T4 drives the load resistor L and is applied to a second resistor R2. A current flowing through the resistors R1, R2 and R3 to ground in each case is proportional to the voltage applied to the relevant resistor. The current flowing through the second resistor R2 is subtracted from the current flowing through the first resistor R1 and a first current $I_1$ is generated, through the use of a transistor stage including two transistors $T_{Diff1}$, $T_{Diff2}$. The first current $I_1$ is proportional to a difference between the supply voltage $V_s$ and the instantaneous output voltage $V_{out}$. A current flowing through the third resistor R3 constitutes a second current $I_2$.

The first current $I_1$ is impressed on the first diode D1 through the use of a transistor $T_{D1}$ and the second current $I_2$ is impressed on the second diode D2 through the use of a transistor $TD_2$. Voltages $V_{D1}$ and $V_{D2}$ dropped across the respective diodes D1 and D2 is proportional to the logarithm of the respective currents $I_1$ and $I_2$. The voltage $V_{D1}$ is applied to the non-inverting input of the operational amplifier Op1, while the voltage $V_{D2}$ is passed to the inverting input of the operational amplifier Op1.

An output voltage of the operational amplifier Op1 is thus proportional to a difference between the logarithms of the currents $I_1$ and $I_2$. After level matching by the level converter P1, which also contains an exponential element, a drive voltage $V_a$ is present at an output of the converter which is proportional to a quotient of the currents $I_1$ and $I_2$ and is thus proportional to a difference between the supply voltage $V_s$ and the instantaneous output voltage $V_{out}$. The difference is related to the supply voltage $V_s$.

With this voltage, the driving of the MOS output stage is regulated back in such a way that "rounded" output characteristic curves are produced, based on which there is only a very low degree of interference radiation.

Figure 2:
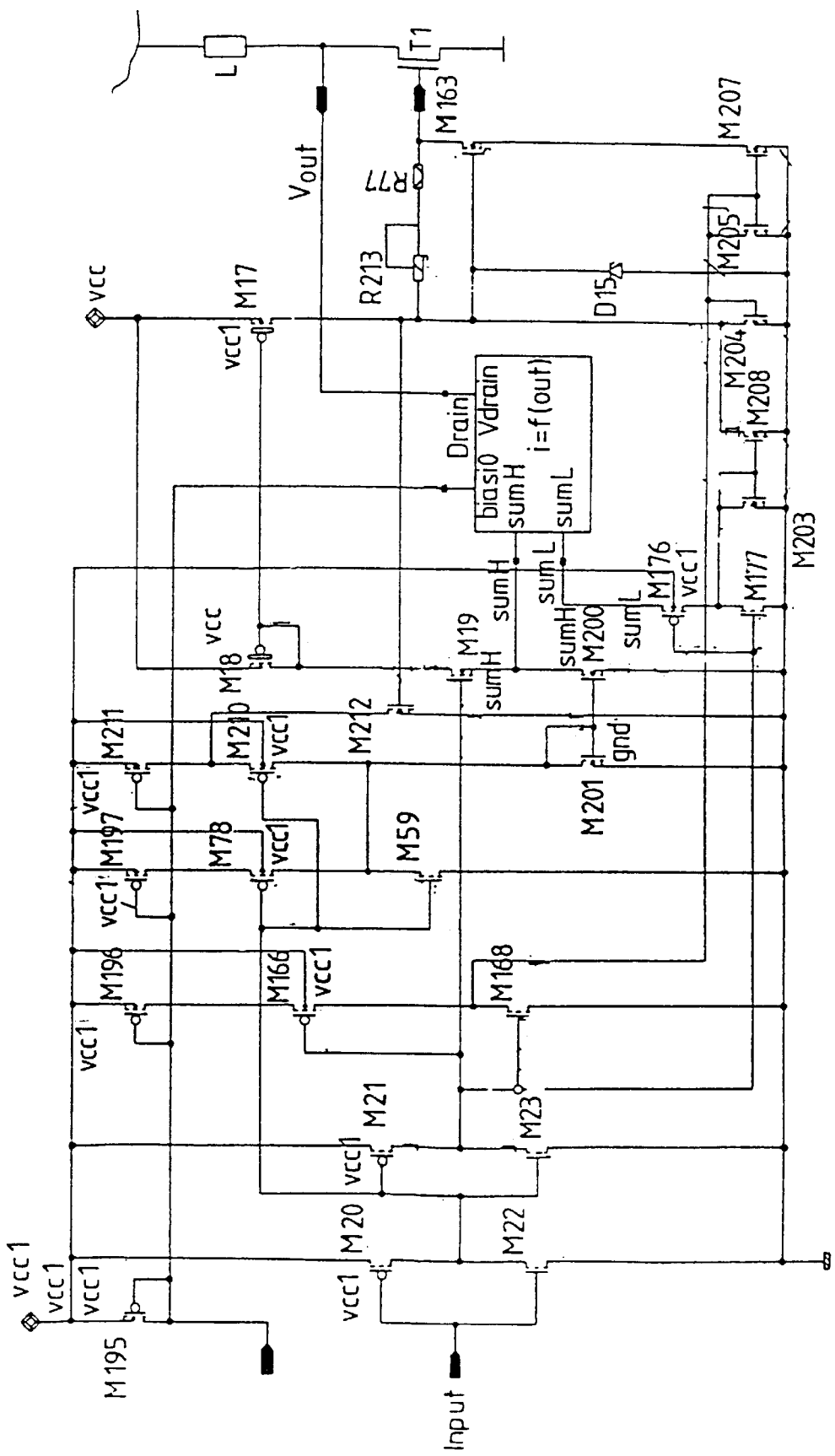
FIG. 2 is an overall circuit diagram of an MOS power switching circuit according to the invention with a drive circuit according to the invention.
Figure 3:
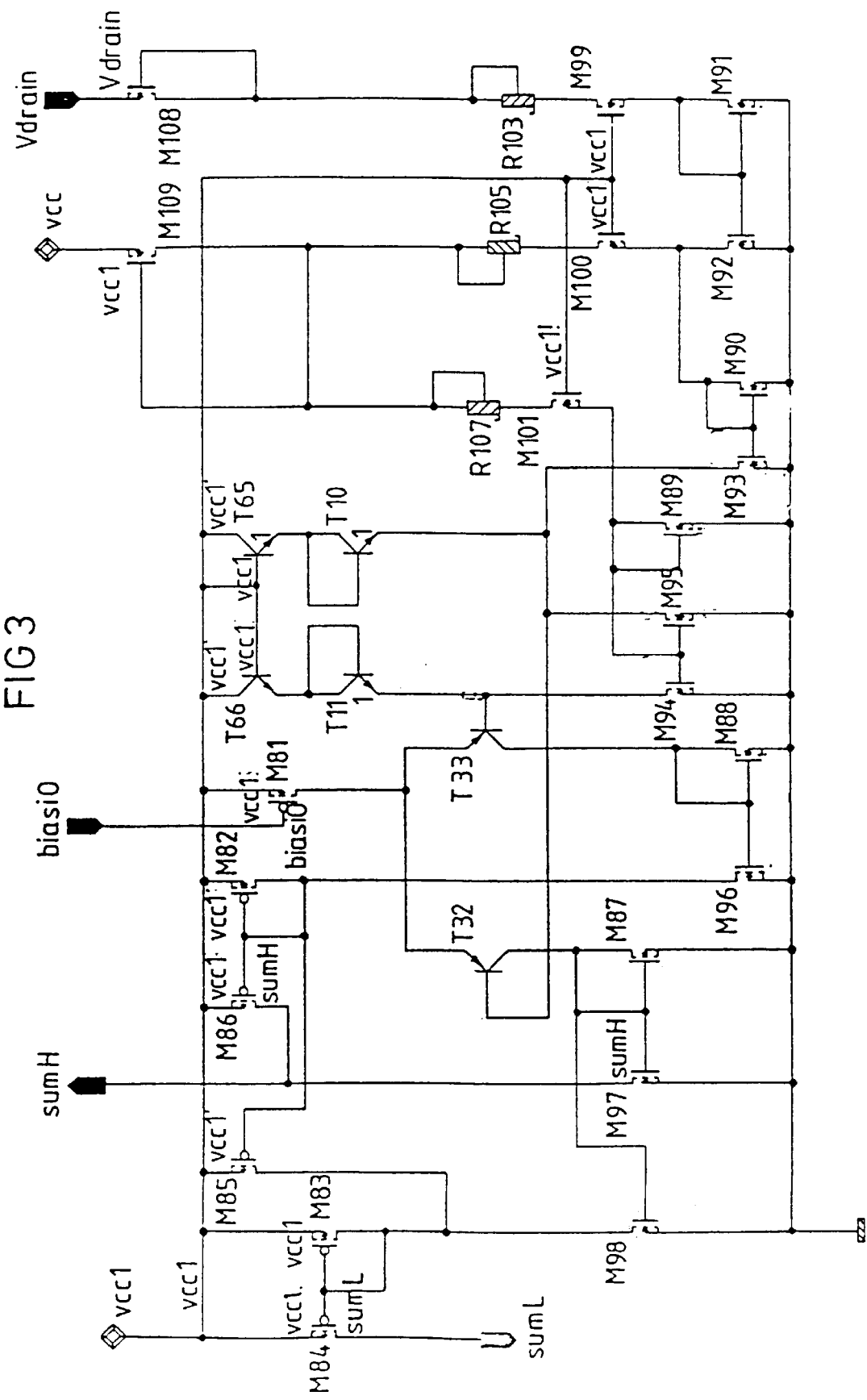
FIG. 3 is a circuit diagram of part of the circuit according to FIG. 2.

FIGS. 2 and 3 show an overall circuit diagram of an MOS power switching circuit according to the invention. A divider corresponding to FIG. 1 is illustrated in FIG. 3.

An essential part of this circuit is the divider i=f (out), which operates as a controlled current source, through the use of which the gate of the transistor T1 is charged and discharged. The output voltage $V_{out}$ at the load resistor L is fed to the divider through its terminal $V_{drain}$. A driver including two transistors M17, M18 serves for charging the gate and a potential Vcc is applied to the driver. The driver is fed by two currents, namely a drain current of a transistor M200 and a current sumH from the divider circuit. Discharge current sinks are provided for discharging the gate. The sinks are formed from current mirrors having transistors M205, M207 (predischarge), a current sink having a transistor M204 (DC component) and current mirrors having transistors M203, M208 (current sumL from the divider circuit).

In detail, the circuit has an input for feeding in an input signal. The input signal is passed through a first transistor stage M20, M22, a following second transistor stage M21, M23 and a subsequent third transistor stage M166, M168 and then passes to the transistors M204, M205 and M207. An output side of the transistor M207 is connected through a series-connected transistor M163 to the gate of the first transistor T1.

An output of the first transistor stage M20, M22 is also connected to a fourth transistor stage M59, M78 and a fifth transistor stage M210, M201. A gate terminal of the transistor M201 is connected to a gate terminal of the transistor M200. An output of a transistor M210 is connected to an output of the transistor M212. A gate of the transistor M212 is connected through series-connected resistors R213 and R77 to the gate of the first transistor T1.

An output of the second transistor stage M21, M23 is furthermore connected to a sixth transistor stage M176, M177. An output of the transistor M176 is connected to a terminal carrying the current sumL of the divider circuit and an output of the transistor M177 is connected to gate terminals of the transistors M203, M208.

The output of the second transistor stage M21, M23 is furthermore connected to a transistor M19, having an output side which is connected to a terminal carrying the current sumH of the divider. The transistor M19 is also connected in series with the transistor M200 and the transistor M18.

The first to sixth transistor stages are formed in each case by two series-connected transistors having gate terminals which are connected to one another in each case and constitute an input of the relevant stage.

Transistors M195, M196, M197 and M211, to which a supply potential Vcc1 is applied, serve for generating and feeding bias voltages to the first, second, third, fourth and fifth transistor stages, as well as to a bias voltage input biasiO of the divider.

The divider i=f (out) is shown in detail in FIG. 3. In comparison with the basic circuit shown in FIG. 1, the following elements correspond to one another functionally: the resistors R3, R1 and R2 respectively correspond to resistors R107, R105 and R103; the transistors $T_{Diff1}$ and $T_{Diff2}$ respectively correspond to transistors M90 and M92; the transistors $T_{D1}$ and $T_{D2}$ respectively correspond to transistors M93 and M94; the diode D1 corresponds to transistors T10, T65; the diode D2 corresponds to transistors T11, T66; and the operational amplifier Op1 corresponds to transistors T32, T33, which are connected as a differential stage.

A voltage picked off at the load resistor L is applied to the terminal Vdrain, which is connected through a transistor M108 to the resistor R103. The resistor R103 is connected through a transistor M99 to a transistor M91, which is connected to the transistor M92. The transistor M92 is connected to the transistor M90, which is connected to the transistor M93.

The maximum output voltage $V_s$ is present at the terminal Vcc, which is connected through a transistor M109 to the resistor R105 as well as to the resistor R107. The resistor R107 is connected to a transistor M101, and the resistor R105 is connected to a transistor M101, which is in turn connected to the transistor M99. The transistor M101 is connected to transistors M89 and M95 as well as to the transistor M94. The transistor M94 and the transistor T11 are connected to an inverting input of the differential stage T33/T32. The transistors M93, M95 and T10 are connected to a non-inverting input of the differential stage T33/T32.

An output of the transistor T32 is connected, on one hand, through transistors M87, M97 to an output terminal carrying the current sumH and, on the other hand, through transistors M98, M83 and M84 to an output terminal carrying the current sumL. An output of the transistor T33 is connected through transistors M88, M96, M82 and M86 to a terminal carrying the current sumH and through the transistors M88, M96, M84 and M83 as well as a transistor M85 to a terminal carrying the current sumL. The terminal biasiO is connected through a transistor M81 to emitters of the transistors T33/T32.

Finally, the divider is also connected to the supply potential Vcc1 mentioned in connection with FIG. 2.

I claim:

1. A power switching circuit with reduced interference radiation, comprising:
    at least one MOS power transistor; and
    a drive circuit connected to said at least one MOS power transistor, said drive circuit configured for generating a drive voltage for driving said at least one MOS power transistor proportional to a quotient of
        a difference between a maximum output voltage of said at least one MOS power transistor and an actual output voltage at said at least one MOS power transistor as a dividend of said quotient and
        the maximum output voltage of said at least one MOS power transistor as a divisor of said quotient.

2. The power switching circuit according to claim 1, wherein said driving circuit has first and second elements for logarithmizing the dividend and the divisor, and a subtractor for subtracting logarithmized values, and a level converter connected to said subtractor and having an exponential element for generating the quotient.

3. The power switching circuit according to claim 2, wherein said first and second elements are respective first and second diodes on which first and second currents are respectively impressed, and the first and second currents are each proportional to the output voltages to be divided.

4. The power switching circuit according to claim 3, including a first resistor to which a supply voltage is applied, a second resistor to which the output voltage is applied, and a transistor differential stage connected to said first and second resistors, the first current generated by said first resistor, said second resistor and said transistor differential stage.

5. The power switching circuit according to claim 4, including a third resistor to which the supply voltage is applied, the second current generated by said third resistor.

6. The power switching circuit according to claim 3, including a resistor to which the supply voltage is applied, the second current generated by said resistor.

7. The power switching circuit according to claim 3, wherein said subtractor has an operational amplifier with a non-inverting input to which a voltage dropped across said first diode is applied and an inverting input to which a voltage dropped across said second diode is applied.

8. The power switching circuit according to claim 1, wherein the maximum output voltage is a supply voltage.

9. The power switching circuit according to claim 1, wherein the dividend is a difference between the maximum output voltage and the actual output voltage multiplied by a predetermined factor.

10. The power switching circuit according to claim 9, wherein the factor has a value selected from the group consisting of 0.5, 1 and 2.

11. A power switching circuit with reduced interference radiation, comprising:
    at least one pair of low-side and high-side MOS power transistors;
    a load resistor connected between said MOS power transistors; and
    a drive circuit connected to at least one of said low-side MOS power transistors, said drive circuit configured for generating a drive voltage for driving said at least one low-side MOS power transistor proportional to a quotient of
        a difference between a maximum output voltage of said at least one low-side MOS power transistor and an actual output voltage at said load resistor as a dividend of said quotient and the maximum output voltage of said at least one low-side MOS power transistor as a divisor of said quotient.

12. The power switching circuit according to claim 11, wherein said driving circuit has first and second elements for logarithmizing the dividend and the divisor, and a subtractor for subtracting logarithmized values, and a level converter connected to said subtractor and having an exponential element for generating the quotient.

13. The power switching circuit according to claim 12, wherein said first and second elements are respective first and second diodes on which first and second currents are respectively impressed, and the first and second currents are each proportional to the output voltages to be divided.

14. The power switching circuit according to claim 13, including a first resistor to which a supply voltage is applied, a second resistor to which the output voltage is applied, and a transistor differential stage connected to said first and second resistors, the first current generated by said first resistor, said second resistor and said transistor differential stage.

15. The power switching circuit according to claim 14, including a third resistor to which the supply voltage is applied, the second current generated by said third resistor.

16. The power switching circuit according to claim 13, including a resistor to which the supply voltage is applied, the second current generated by said resistor.

17. The power switching circuit according to claim 13, wherein said subtractor has an operational amplifier with a non-inverting input to which a voltage dropped across said first diode is applied and an inverting input to which a voltage dropped across said second diode is applied.

18. The power switching circuit according to claim 11, wherein the maximum output voltage is a supply voltage.

19. The power switching circuit according to claim 11, wherein the dividend is a difference between the maximum output voltage and the actual output voltage multiplied by a predetermined factor.

20. The power switching circuit according to claim 19, wherein the factor has a value selected from the group consisting of 0.5, 1 and 2.

21. The power switching circuit according to claim 11, including another drive circuit connected to at least one of said high-side MOS power transistors, said other drive circuit configured for dividing an actual output voltage at said load resistor as a dividend, by a maximum output voltage of said at least one high-side MOS power transistor as a divisor.

* * * * *